(12) United States Patent
Okubora et al.

(10) Patent No.: US 6,445,475 B1
(45) Date of Patent: Sep. 3, 2002

(54) METHOD FOR PRACTICALLY LOADING TRANSMISSION OR RECEIVING MODULE FOR OPTICAL LINK AND ITS RIGID FLEXIBLE BOARD

(75) Inventors: Akihiko Okubora; Takahiko Kosemura, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/323,620

(22) Filed: Jun. 1, 1999

(30) Foreign Application Priority Data

Jun. 2, 1998 (JP) .......................................... 10-170592

(51) Int. Cl.[7] .............................. H04B 10/12; H04B 1/10
(52) U.S. Cl. ....................................... 359/173; 455/301
(58) Field of Search .......................... 455/301; 359/173; 257/79, 81, 84, 93, 99; 181/183

(56) References Cited

U.S. PATENT DOCUMENTS

| | | | | |
|---|---|---|---|---|
| 3,766,439 A | * | 10/1973 | Isaacson ..................... | 317/100 |
| 4,658,334 A | * | 4/1987 | McSparran et al. .......... | 361/415 |
| 4,904,968 A | * | 2/1990 | Theus ......................... | 333/246 |
| 4,928,206 A | * | 5/1990 | Porter et al. ................. | 361/699 |
| 5,170,328 A | * | 12/1992 | Kruppa | |
| 5,535,034 A | * | 7/1996 | Taniguchi ................... | 359/152 |
| 5,740,527 A | * | 4/1998 | Mitama ....................... | 455/301 |
| 5,789,815 A | * | 8/1998 | Tessier et al. ............... | 257/723 |
| 6,195,261 B1 | * | 2/2001 | Babutzka et al. ............ | 361/752 |
| 6,259,602 B1 | * | 7/2001 | Malhammar ................ | 361/704 |

* cited by examiner

Primary Examiner—Jason Chan
Assistant Examiner—David C Payne
(74) Attorney, Agent, or Firm—Jay H. Maioli

(57) ABSTRACT

A method for practically loading a small-sized and compact transmission or receiving module for an optical link in which interference between a receiving circuit and a transmission circuit can be prevented, high speed and high quality communications with a high S/N ratio can be carried out, and generated heat at the IC or the like can be discharged efficiently to a surrounding atmosphere, wherein at least a pair optical fibers 2 are installed at a fiber installing part 4, each light emitting element 5 and light receiving element 6 is arranged in a direction of an optical axis each of transmission optical fiber and receiving optical fiber installed at the fiber installing part, a first board 10 connected to root portions of the lead terminals of the light emitting element and the light receiving element is integrally formed with a second board 12 and a third board 14 respectively connected to both opposing ends of the first board through a flexible board, and the second board and the third board are folded at a substantial right angle to the first board in such a way that the second board and the third board face away from each other.

10 Claims, 10 Drawing Sheets

METHOD FOR PRACTICALLY LOADING TRANSMISSION OR RECEIVING MODULE FOR OPTICAL LINK AND ITS RIGID FLEXIBLE BOARD

BACKGROUND OF THE INVENTION

1. Field of the Invention

This invention relates to a transmission or receiving module for an optical link such as optical communications, optical links and optical fiber channels or the like, and more particularly a method for practically loading a small-sized and compact transmission or receiving module for an optical link in which high quality communications can be performed and including rigid flexible board.

2. Description of the Related Art

In recent years, as the technologies of wired or wireless communications such as a cellar telephone, ISDN and the like or processing capabilities in a personal computer or the like have been remarkably improved and also as an audio-visual equipment has been developed for processing signals in digital form, a trend has been promoted in which all kinds of media have been transmitted or received through a network under application of a technology of information communication network.

In a recent trend in which networks such as LAN (Local Area Network) or WAN (Wide Area Network) as well as an internet have been widely distributed for a business use and a personal use, it might be considered to have an environment in the future in which a network is constituted by home-use electric appliances or Audio-Visual equipment within a home mainly on the basis of a personal computer and information processed through a telephone line, CATV, a ground wave TV, satellite broadcastings/communications or the like and in which the elements are freely interactive with each other.

In this case, it is desired to attain a transmission speed such as 100 Mbps to 1 Gbps as a communication capability for making a free interactive operation of image data in a range of several Mbps to several tens Mbps.

At present, although a development of technology about an optical formation mainly on the basis of a main line system for optical communications, LAN or the like, an optical transmission or receiving module used in the above technology is quite expensive. This is caused by the fact that it is necessary to apply a quite precise position alignment technology between a light emitting element and an optical fiber or a light receiving element and an optical fiber in order to keep performances such as transmission speed or transmission quality or the like and that its structure is complex and expensive in view of a countermeasure against a leaked light, an electromagnetic interference or a countermeasure against noise or the like. In order to distribute the optical communications and optical transmission technology for a general purpose, it is an urgent requirement to attain a low cost while its performance is kept at a high level.

In recent years, manufacturing technology to attain a low cost or a high range for POF (Plastic Optical Fiber) such as PMMA (PolyMethyl Meta-Acrilate) or PC (Poly-Carbonate) with its core diameter being large and formed at a low cost has been developed and a problem in positional alignment at a short distance optical transmission with 100 m or less is being eliminated.

FIG. 1 is a side elevational view in section for showing one example of a transmission or receiving module for an optical link for POF and FIG. 2 shows an outer appearance view of it. As indicated in FIGS. 1 and 2, an optical fiber 2 is comprised of a core 2a at its central part and a clad 2b at a circumferential part with a lower refraction rate than that of the core 2a. The extremity end of the clad 2b is provided with a protrusion 2c. The protrusions 2c of the two optical fibers 2 for transmission and receiving are engaged with concave grooves 74a of two holes 74 passed through a fiber installing part 73 of a receptacle module 72, and then the optical fiber 2 is installed at the fiber installing part 73 through its friction lock. A partition plate 75 at the rear end of the receptacle module 72 is provided with each of a light emitting element 77 and a light receiving element 78 in coaxial with the transmission optical fiber 2 and the receiving optical fiber 2. Each of the light emitting element 77 and the light receiving element 78 is stored in a can package, respectively, each of lead terminals 77a and 78a is brought up to a transmission circuit 81 and a receiving circuit 82 on a circuit board 80 having an electric circuit formed thereon and then the lead terminals are directly soldered on the circuit board. ICs 84 are loaded on the transmission circuit 81 and the receiving circuit 82, and a fixing pin 86 for use in fixing the transmission or receiving module 71 for an optical link is fixed to the bottom plate of a casing 85 storing the circuit board 80 therein. Further, wiring pins 87 are connected to the transmission circuit 81 and the receiving circuit 82.

However, in the case of a method for practically loading the transmission or receiving module for an optical link described above, lead terminals 77a, 78a extending from the light emitting element 77 and the light receiving element 78 must be extended over a substantial long distance in the air, resulting in that their lead inductance or the like may become a trouble during a high speed operation and further deterioration in isolation caused by relative inductances at the transmission side and the receiving side may become a problem.

Further, as shown in FIG. 1, it is generally applied that any one of the receiving circuit and the transmission circuit is formed at an upper surface side or a lower surface side in order to avoid interference. However, even if a ground surface is arranged at the central part of the circuit board 80 to divide the upper circuit and the lower circuit into two sections, it may not be avoided to a certain extent that an interference may occur by an electrostatic coupling effect in the ground surface and each of the signal lines. Further, the circuit performing a high speed operation produced a large amount of heat of ICs and the constitution shown in FIG. 1 had a problem that a design for radiating heat became difficult.

SUMMARY OF THE INVENTION

In view of the foregoing, it is an object of the present invention to provide a method for practically loading a small-sized and compact transmission or receiving module for an optical link in which an interference between the receiving circuit and the transmission circuit can be prevented, generated heat at the ICs or the like can be radiated efficiently to surrounding atmosphere and also provide a rigid flexible board.

A method for practically loading a transmission or receiving module for an optical link of the present invention is carried out such that at least a pair of optical fibers in the transmission or receiving module for an optical link connected to the optical fibers are installed at a fiber installing part, each of light emitting element and light receiving element is arranged in a direction of optical axis of each of transmission optical fiber and receiving optical fiber installed at the fiber installing part, a first board connected to root portions of the lead terminals of the light emitting element and the light receiving element is integrally formed with a second board and a third board connected to each of both opposing side ends of the first board through a flexible board, and the second board and the third board are bent at a substantial right angle against the first board in such a way that the second board and the third board may be oppositely faced from each other.

In addition, the method for practically loading the transmission or receiving module for an optical link of the present invention is carried out such that a transmission line having a less amount of deterioration in a signal waveform of which impedance control can be performed is applied on the flexible board.

In addition, the method for practically loading the transmission or receiving module for an optical link of the present invention is carried out such that each of the second board and the third board is separately formed with each of the transmission circuit and the receiving circuit.

In addition, the method for practically loading the transmission or receiving module for an optical link of the present invention is carried out such that as the second and the third board as well as the first board, a rigid flexible board having the flexible board connecting each of the boards formed as a core is applied.

In addition, the method for practically loading the transmission or receiving module for an optical link of the present invention is carried out such that only the flexible board of at least one of the second and third boards is extended be applied as either a power supply or a ground potential and further it is bent and inserted between the second and third boards.

In addition, the method for practically loading the transmission or receiving module for an optical link of the present invention is carried out such that a metallic partition plate acted as either a power supply or having a ground potential is inserted between the second board and the third board.

In addition, the method for practically loading the transmission or receiving module for an optical link of the present invention is carried out such that the metallic partition plate inserted between the second board and the third board is integrally formed with at least one of a side surface, a bottom surface and a top surface of a module casing.

In addition, the method for practically loading the transmission or receiving module for an optical link of the present invention is carried out such that the first, second and third boards are stored in a casing while being bent and a member having a superior thermal conduction is placed between the casing and heat generating components on the second board and the third board.

In addition, the method for practically loading the transmission or receiving module for an optical link of the present invention is carried out such that further one board or more are connected to each of the second board and the third board through the flexible board.

In addition, the method for practically loading the transmission or receiving module for an optical link of the present invention is carried out such that the flexible board is one or more boards of the first, second and third boards.

The rigid flexible board of the present invention is made such that a first board is integrally formed with a second board and a third board connected to each of both opposing side ends of the first board through a flexible board, this flexible board connecting each of the boards from each other is formed as a core, and the second board and the third board are bent at a substantial right angle against the first board in such a way that the second board and the third board may be oppositely faced from each other, wherein at least one of the second board and the third board has an extended flexible board and this extended flexible board is applied as a power supply or having a ground potential.

In addition, the rigid flexible board of the present invention is made such that a flexible board between the first board and the second board and another flexible board between the first board and the third board are formed with a transmission line having a less amount of deterioration in signal waveform in which an impedance can be controlled.

DETAILED DESCRIPTION OF THE PREFERRED EMBODIMENT

Figure 1:
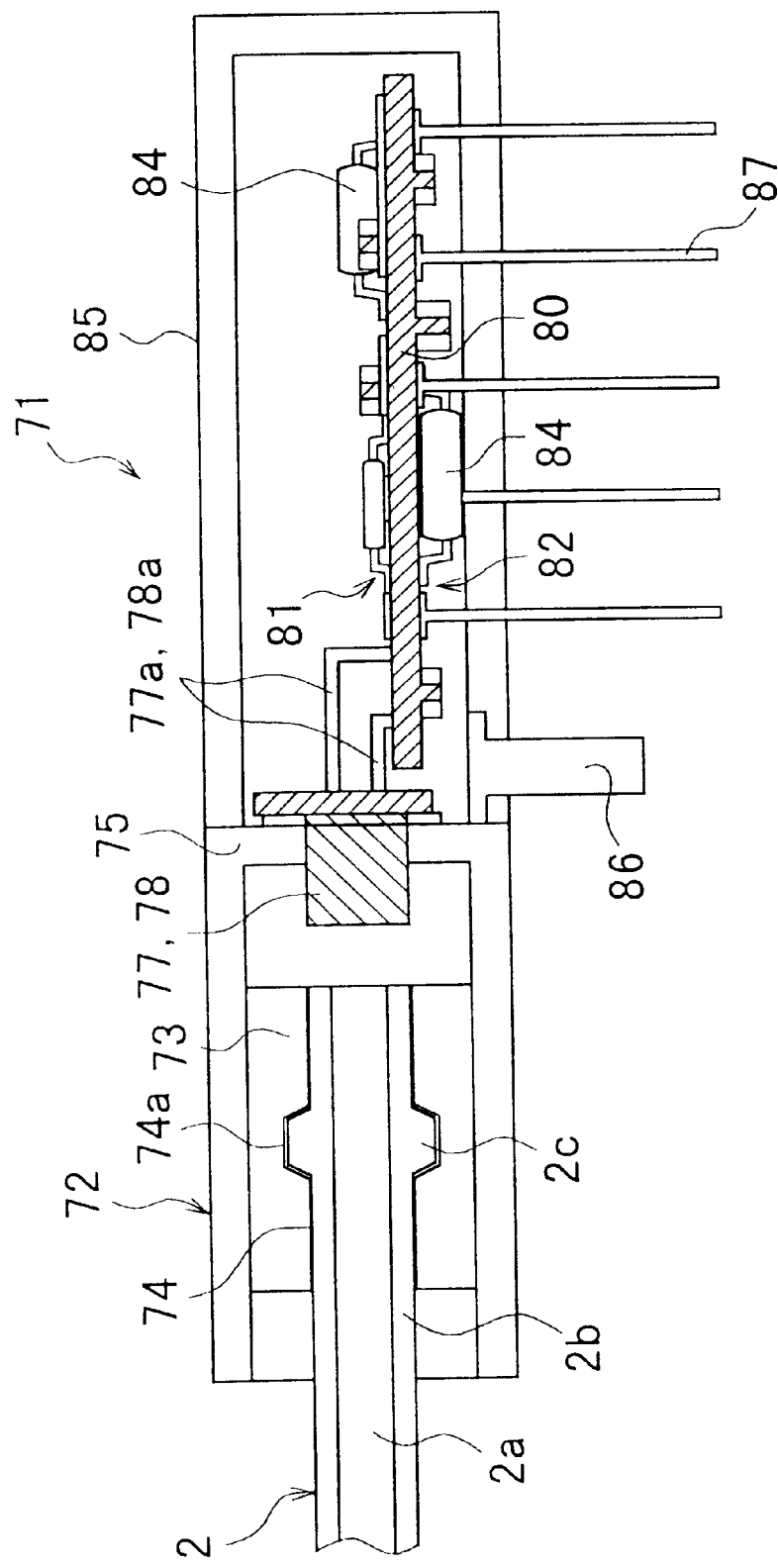
FIG. 1 is a side elevational view in section for showing a transmission or receiving module for an optical link of the prior art.
Figure 2:
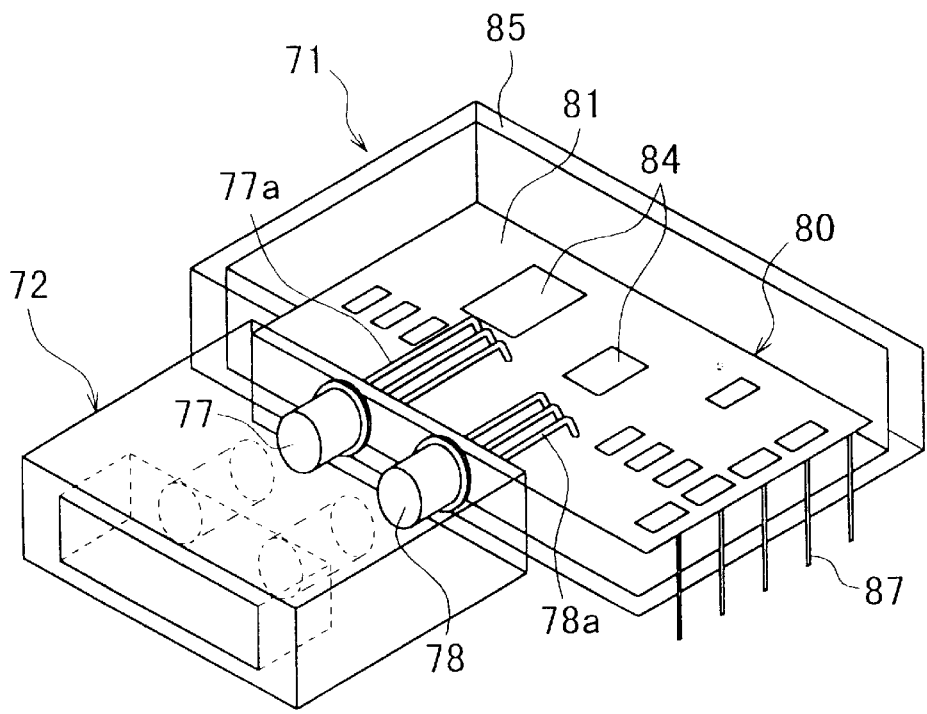
FIG. 2 is an assembling figure for showing a transmission or receiving module for an optical link of the prior art.

Referring now to the drawings, examples of the preferred embodiments of the method for practically loading a transmission or receiving module for an optical link of the present invention will be described.

Figure 4:
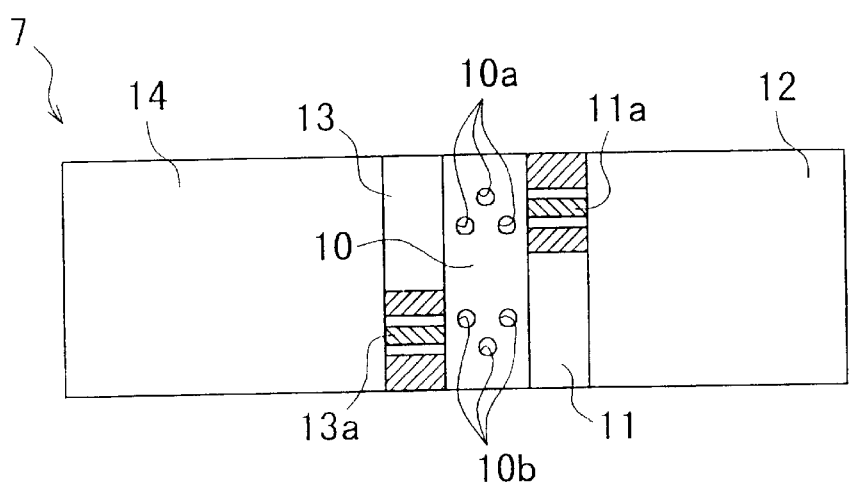
FIG. 4 is a top plan view for showing a rigid flexible board being kept open.
Figure 3:
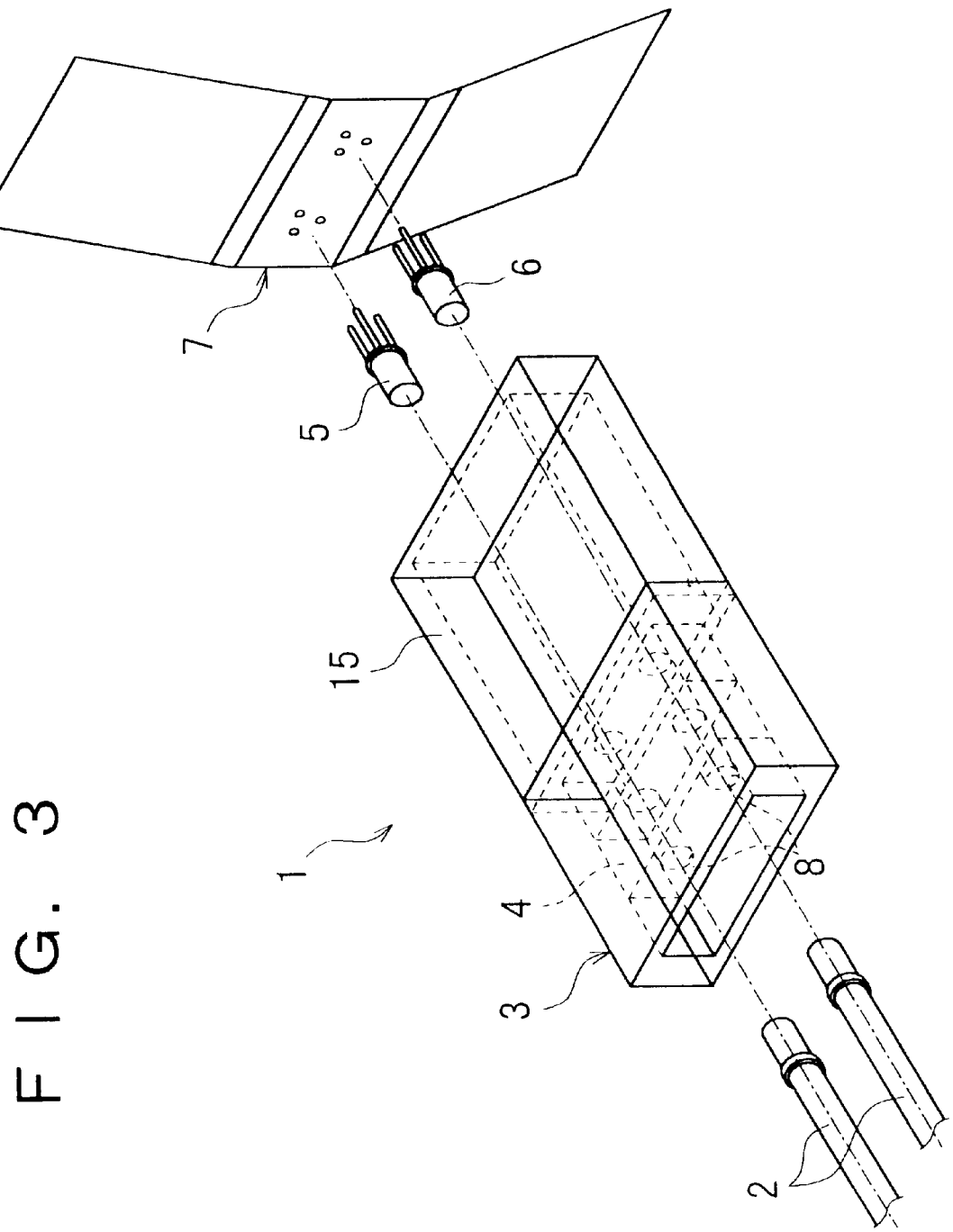
FIG. 3 is a schematic exploded perspective view for showing a transmission or receiving module for an optical link to indicate a first preferred embodiment of a method for practically loading the transmission or receiving module for an optical link of the present invention.
Figure 5:
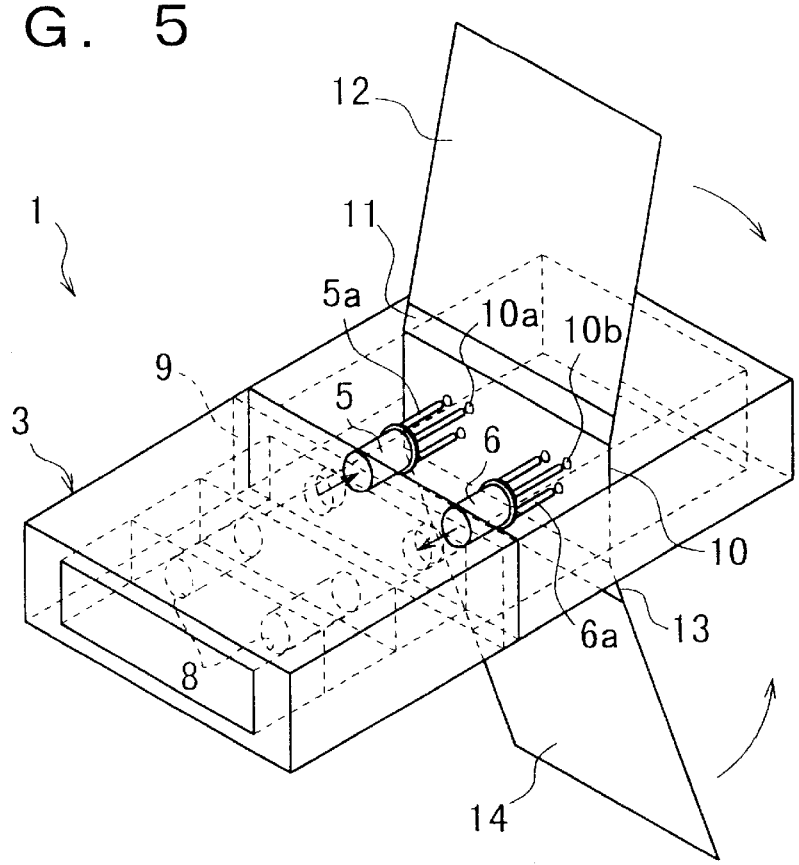
FIG. 5 is an assembling figure for showing a transmission or receiving module for an optical link of the first preferred embodiment.
Figure 6:
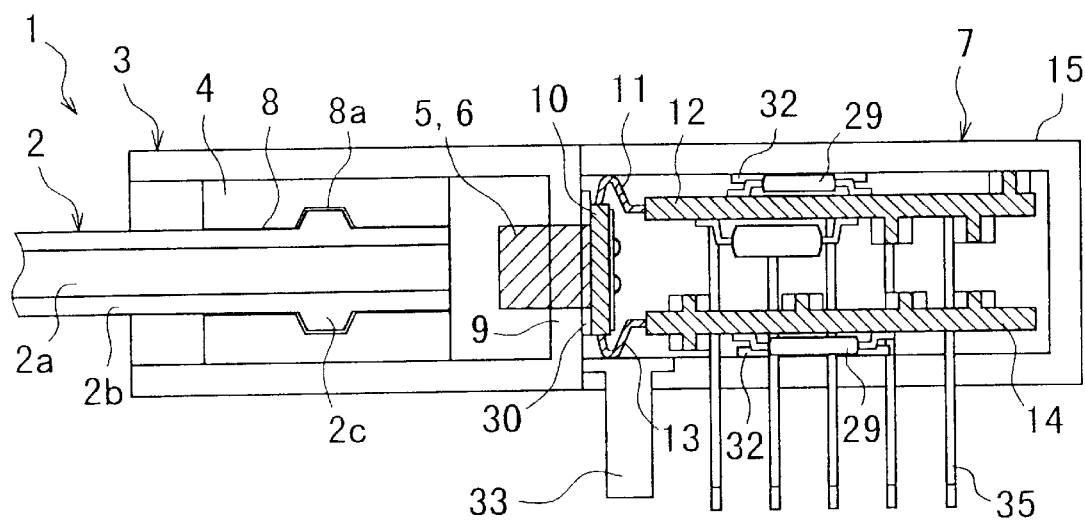
FIG. 6 is a side elevational view in section for showing a transmission or receiving module for an optical link of the first preferred embodiment.

FIG. 3 is a schematic exploded perspective view for showing a transmission or receiving module for an optical link to which a method for practically loading the transmission or receiving module for an optical link of the present invention is applied, FIG. 4 is a top plan view for showing a rigid flexible board being kept open, FIG. 5 is an assembling figure for showing a transmission or receiving module for an optical link and FIG. 6 is a side elevational view in section for showing a transmission or receiving module for an optical link. As shown in FIG. 3, the transmission or receiving module 1 for an optical link is substantially comprised of a fiber installing part 4 of a receptacle module 3 connected to the optical fibers 2; a light emitting element 5 and a light receiving element 6 arranged on the extending lines of the optical fibers 2 installed on this fiber installing part 4; a rigid/flexible board 7 connected to the light emitting element 5 and the light receiving element 6, to which a signal from the light receiving element 6 is inputted and processed there and from which a signal is outputted by the light emitting element 5; and a casing 15 for storing the rigid/flexible board 7.

At first, the receptacle module to be connected to the optical fibers will be described. As shown in FIG. 6, the optical fiber 2 is formed by a core 2a at its central part, and a clad 2b at a circumferential part with a lower refraction rate than that of the core 2a, wherein the extremity end of the clad 2b is expanded or bulged out toward a circumference part and a protrusion 2c is projected from it. The fiber installing part 4 of the receptacle module 3 is formed with a pair of right and left holes 8 into which two optical fibers 2 for transmission and receiving operations are inserted, and the inner wall of the hole 8 is provided with a concave groove 8a fitted to the protrusion 2c of the optical fiber 2. That is, the position of the optical fiber 2 is set and fixed at the fiber installing part 4 by the protrusion 2c of the optical fiber 2 and the concave groove 8a of the hole 8 so as to cause the center of the optical fiber 2 to be coincided with the desired positions of the light emitting element 5 and the light receiving element 6. Then, a partition plate 9 at the rear end of the receptacle module 3 is formed with a pair of right and left holes and then each of the light emitting element 5 and the light receiving element 6 is inserted into and fixed to the holes in coaxial with the transmission optical fiber 2 and the receiving optical fiber 2.

Then, the rigid/flexible board for connecting the light emitting element with the light receiving element will be described. As shown in FIGS. 4 and 5, three leads 5a of the light emitting element 5 are soldered and connected to a central board 10 acting as the first board through the three lead holes 10a, the three leads 6a of the light receiving element 6 are soldered to and fixed to the central board 10 through three lead holes 10b. A transmission circuit board 12 acting as the second board is connected to the upper side of the central board 10 (the right side as viewed in FIG. 4) through a flexible board 11 which can be bent, and a receiving circuit board 14 acting as the third board is connected to the lower side of the central board 10 (the left side as viewed in FIG. 4) through a flexible board 13 which can be bent. In addition, each of the flexible boards 11, 13 is provided with a transmission line having a less amount of deterioration in signal waveform and in which the impedance can be controlled, wherein in this case, there are provided coplanar lines 11a, 13a, for example. Further, there may be provided a micro-strip type transmission line in addition to the coplanar type transmission line. An impedance in a signal line is kept constant by the coplanar lines 11a, 13a so as to prevent any disturbance in waveform of signal or irregular-shaped wave or the like. Then, the rigid/flexible board 7 is comprised of the central board 10, the flexible boards 11, 13, the transmission circuit board 12 and the receiving circuit board 14.

Figure 7:
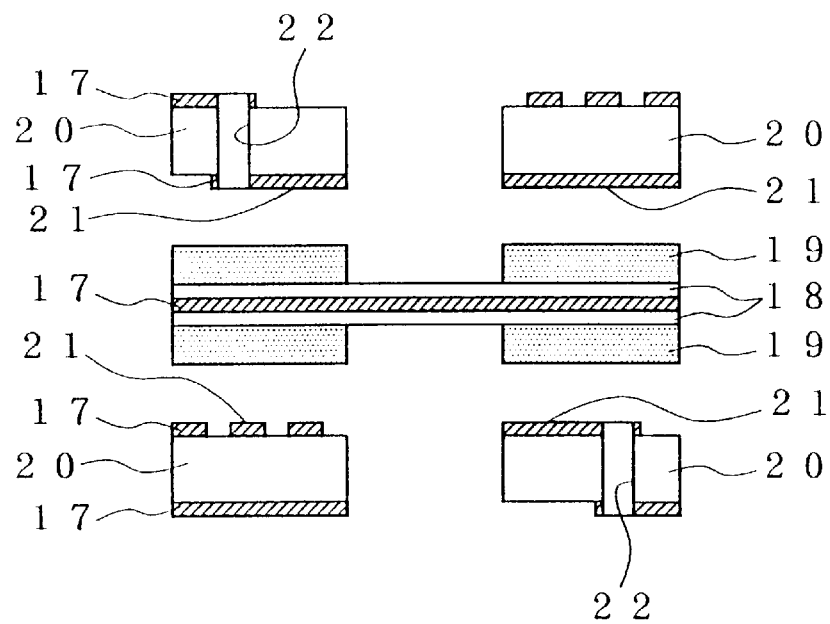
FIG. 7 shows one example of a method for forming a rigid flexible board.
Figure 8:
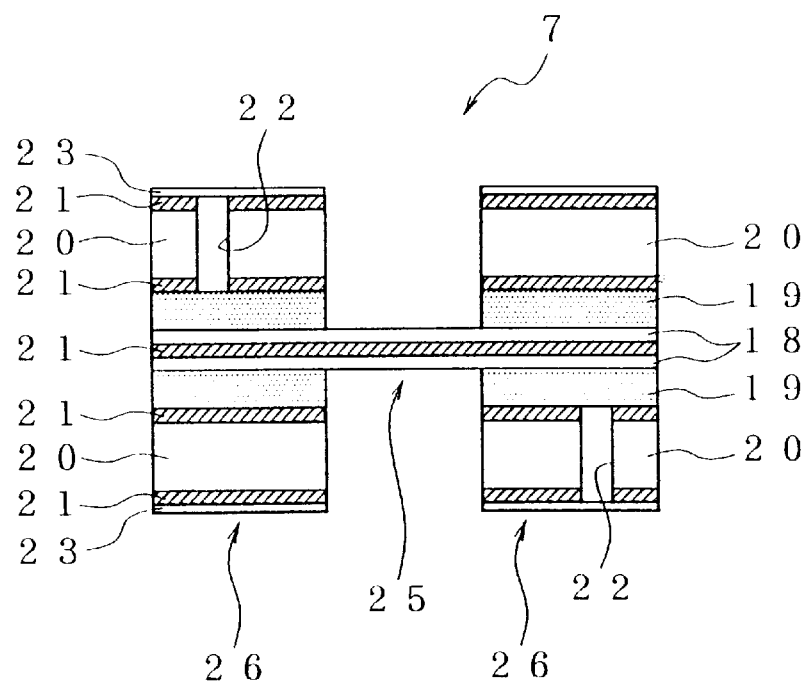
FIG. 8 is a view for showing a sectional structure of a rigid flexible board.

Then, a method for forming the rigid/flexible board will be described. FIG. 7 shows one example of a method for forming the rigid/flexible board. Polyimide coatings 18 acting as inductance members are applied to both surfaces of copper foil (ground layer) 17 at the central part of the board, and glass epoxy double-surface boards 20 already having the circuit formed therein are adhered only at the desired positions in a vertical direction through adhesive material 19. In the figure, reference numeral 21 denotes circuit forming surfaces, wherein a predetermined circuit is formed by a copper foil, and reference numeral 22 denotes a feed through for use in avoiding a wiring at the other layer. The rigid flexible board comprised of five layers formed by such a method as above is indicated in FIG. 8. FIG. 8 is a view for showing a sectional structure of the rigid flexible board and reference numeral 23 denotes a solder resist for discriminating a soldered part in the copper foil from a non-soldered part in the copper foil. Accordingly, the rigid/flexible board 7 is formed by a flexible board 25 comprised of a central copper foil 17 and polyimide 18, and the rigid board 26 comprised of the glass epoxy double-surface board 20 and the like.

Figure 9:
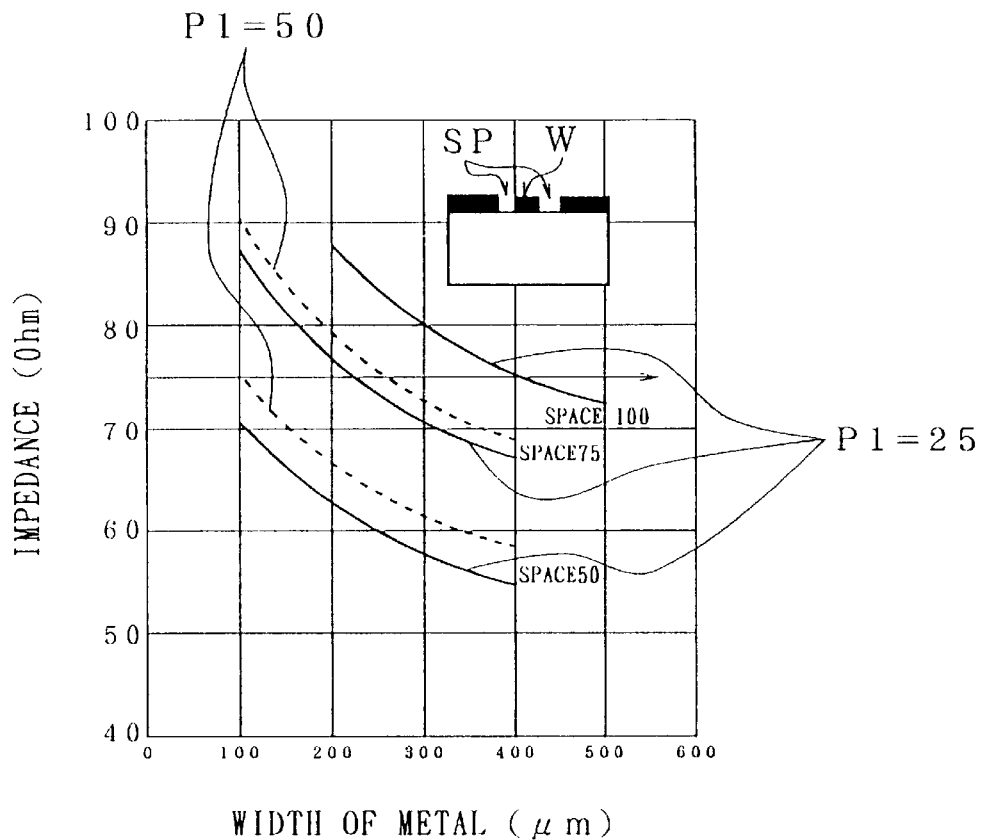
FIG. 9 is a view for showing a result of calculation of a performance impedance at a co-planer line.

In addition, in the example shown in FIG. 8, the flexible board 25 is one layer of electrical conductive layer, wherein in this case, as shown in FIG. 4, a structure of ground-signal-ground in two-dimensional size was made and co-planer lines 11a, 13a were formed as transmission lines. At this time, if a gap between the lines, a line width, a thickness of inductor and a thickness of conductor or the like are kept constant, an impedance in the transmission line is determined uniformly. In FIG. 9 is indicated a result of calculation of the impedance in regard to a gap width and a line width when a thickness of the conductor (copper foil) is 18 $\mu$m and total thicknesses of the conductor (polyimide) are 25 $\mu$m and 50 $\mu$m. In general, when it is desired that a length of the line is sufficiently short as compared with an operating frequency, it is preferable that the impedance is kept low when it is desired to make a damping of a waveform and in turn the impedance is set to be high when the waveform is made steep.

Then, as shown in FIG. 6, after the component parts such as IC 29, a coil, a capacitor and a resistor or the like are practically loaded at desired positions on the rigid/flexible board 7 made in this way, the light emitting element 5 and the light receiving element 6 are loaded on the partition plate 9 of the receptacle module 3. At this time, the two optical fibers 2 are actually installed at the fiber installing part 4, and the light emitting element 5 and the light receiving element 6 are fixed to the partition plate 9 with adhesive agent or the like while the optical fibers are being monitored in such a way that an optical output for the optical fiber 2 or an optical input from the optical fiber 2 may become maximum. In addition, in the case that it is desired to attain an effect of thermal radiation, a lining is carried out with a metallic plate 30 or the like.

Then, as shown in FIGS. 5 and 6, the central board 10 of the rigid/flexible board 7 having some component parts installed therein is inserted into the roots of the leads 5a, 6a of the light emitting element 5 and the light receiving element 6 through the lead holes 10a, 10b, and the leads 5a, 6a are soldered to the central board 10, thereafter surplus leads are cut. Then, the transmission circuit board 12 and the receiving circuit board 14 are stored in the casing 15 through the flexible boards 11, 13 in such a way that they may be oppositely faced to each other, i.e. by folding the transmission circuit board 12 in a downward direction and the receiving circuit board 14 in an upward direction at a substantial right angle, respectively. At this time, a thermal radiation member 32 having a superior thermal conduction is placed between the heat generating components such as ICs 29 or the like installed at the transmission circuit board 12 and the receiving circuit board 14 and the casing 15. As the thermal radiating member having a superior thermal conduction, either the thermal radiation resin or rubber or the like can be applied. It is possible that heat generated from the ICs 29 is efficiently released through the thermal radiation member 32 to the casing 15. A fixing pin 33 for use in fixing the transmission or receiving module 1 for an optical link is fixed to the bottom plate of the casing 15 and further a wiring pin 35 is connected to the transmission circuit board 12 and the receiving circuit board 14.

Accordingly, since the transmission circuit board 12 and the receiving circuit board 14 are folded through the flexible boards 11, 13, it is possible to realize the small-sized, convenient and low cost transmission or receiving module for an optical link.

In addition, since the roots of the leads 5a, 6a of the light emitting element 5 and the light receiving element 6 are directly soldered to the central board 10, a trouble-some state when the leads are extended in a longitudinal direction is eliminated to enable a high speed operation to be carried out.

In addition, since either the coplanar line or the microstrip line is used as a transmission line structure, it is possible to perform an impedance control, reduce a deterioration in waveform of a signal and further to perform high quality communications with a high speed and a high S/N ratio.

Figure 10:
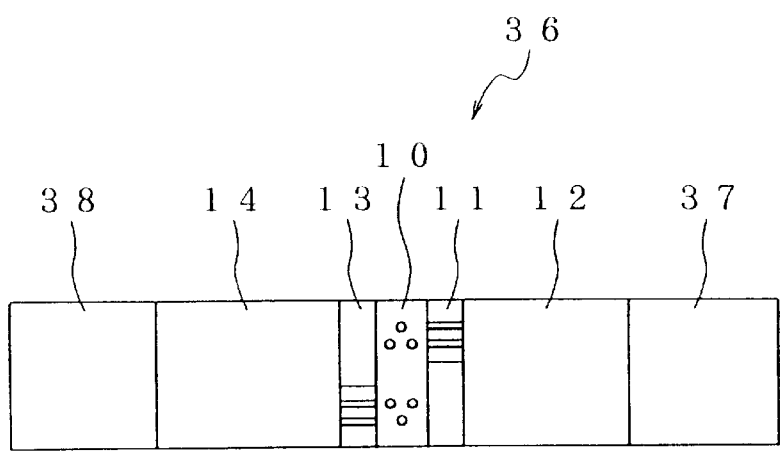
FIG. 10 is a top plan view for showing a rigid flexible board to indicate a second preferred embodiment.
Figure 11:
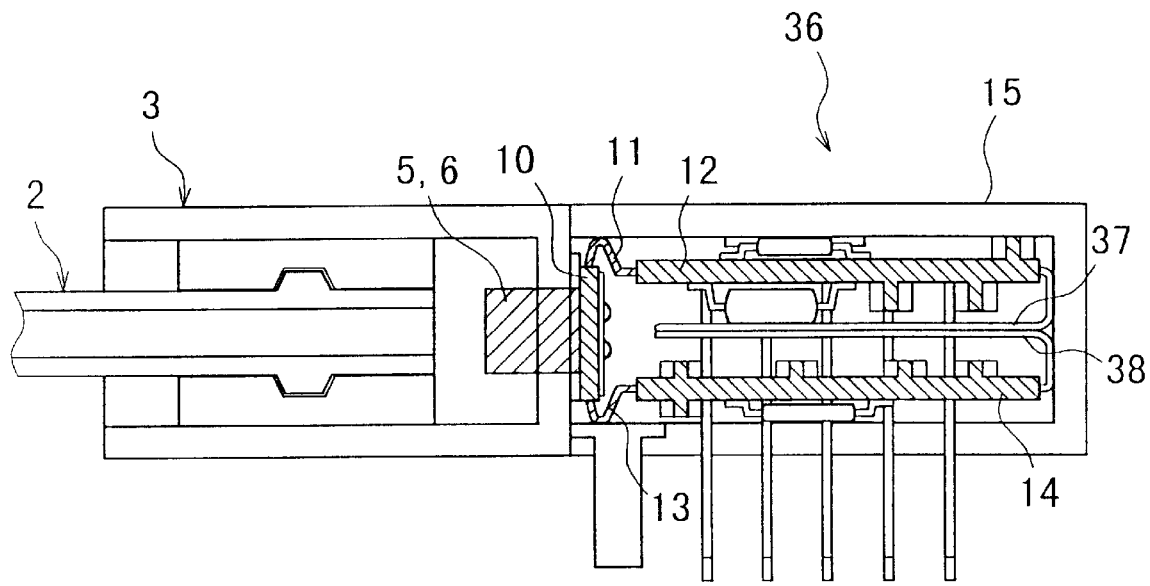
FIG. 11 is a side elevational view in section for showing a transmission or receiving module for an optical link to indicate a second preferred embodiment.

Then, a second preferred embodiment of the method for practically loading a transmission or receiving module for an optical link will be described. In the first preferred embodiment shown in FIG. 6, although it is possible that the transmission circuit board 12 and the receiving circuit board 14 are formed in an electrical independent manner from each other, there is a possibility that a deterioration in cross-talk between the channels caused by a spatial electromagnetic interference up to now or a deterioration of a C/N ratio is produced due to the fact that they are placed at opposing positions from each other. Then, as shown in FIG. 10, the flexible board 36 is made such that the flexible boards 37, 38 are extended on each of the extending lines of the transmission circuit board 12 and the receiving circuit board 14 so as to form the ground layer. Then, as shown in FIG. 11, the rigid/flexible board 36 constituted in such a way as above is made such that the transmission circuit board 12 and the receiving circuit board 14 are bent through the flexible boards 11, 13, and then the flexible boards 37, 38 are bent between the transmission circuit board 12 and the receiving circuit board 14 and they are practically loaded within the casing 15. With such an arrangement as above, it is possible to attain a substantial effect in view of preventing a deterioration of cross-talk between the channels caused by a spatial electromagnetic interference or deterioration in a C/N ratio.

Figure 12:
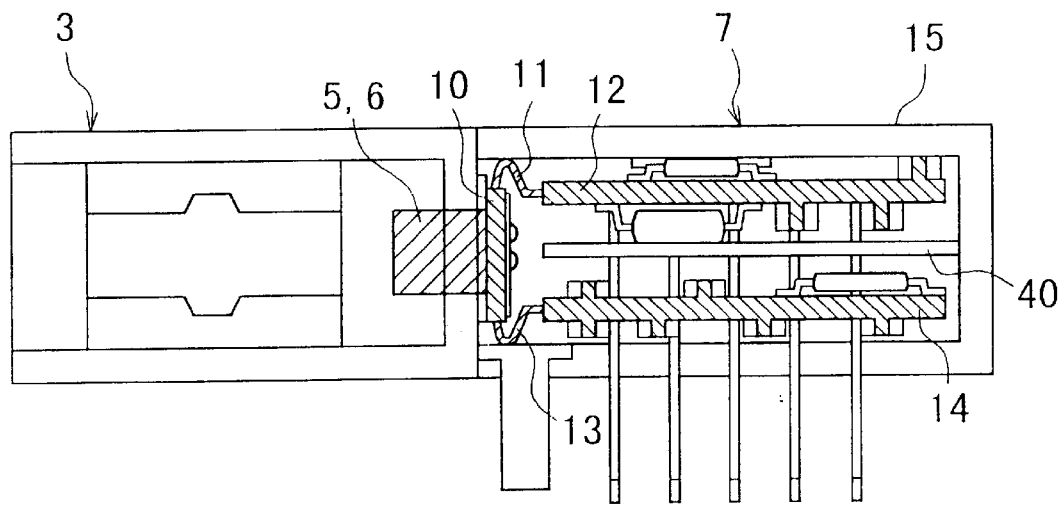
FIG. 12 is a side elevational view in section for showing a transmission or receiving module for an optical link to indicate a third preferred embodiment.

In addition, FIG. 12 shows a third preferred embodiment, wherein it is constituted such that a metallic partition plate 40 is arranged within the casing 15, the transmission circuit board 12 and the receiving circuit board 14 of the rigid/flexible board 7 are partitioned and spaced apart by this metallic partition plate 40 and others are similarly constituted in the same manner as that of the first preferred embodiment shown in FIG. 3. The metallic partition plate 40 is integrally formed with at least one of side surfaces, a bottom surface and a top surface of the casing 15. It is possible to prevent deterioration in cross-talk between the channels caused by the spatial electromagnetic interference or deterioration of a C/N ratio, and further it is also possible to radiate heat as a thermal radiating plate.

Figure 13:
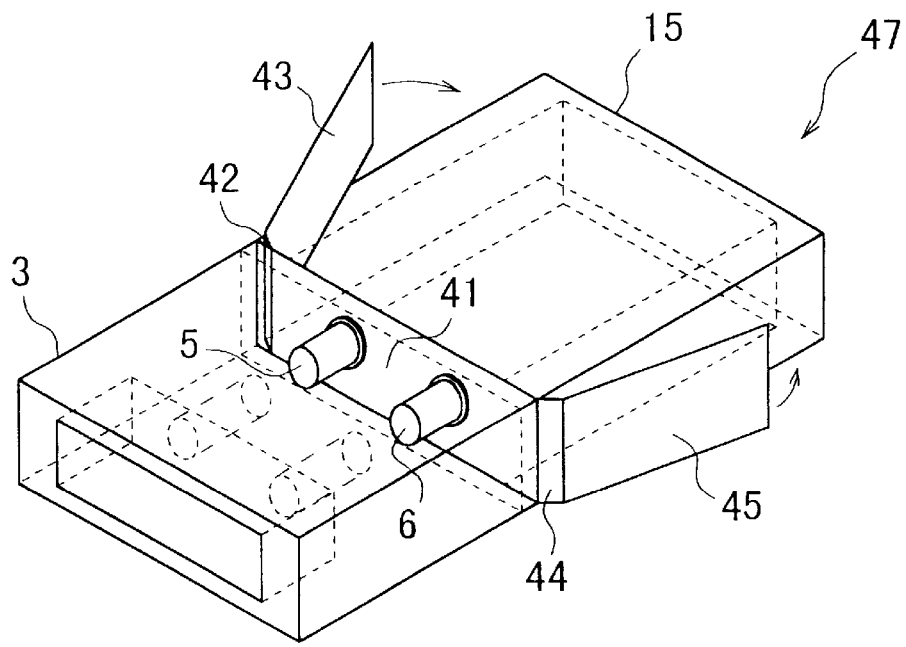
FIG. 13 is an assembling figure for showing a transmission or receiving module for an optical link to indicate a fourth preferred embodiment.

Further, FIG. 13 shows a fourth preferred embodiment, wherein the transmission circuit board 43 of the second board is connected to one side of the right and left sides of the central board 41 through the flexible board 42, the receiving circuit board 45 of the third board is connected to the other side of the central board 41 through the flexible board 44 so as to form a rigid/flexible board 47. That is, the rigid/flexible board 47 is bent at a substantial right angle in such a way that the transmission circuit board 43 and the receiving circuit board 45 may be oppositely faced through the flexible boards 42 and 44 and then stored in the casing 15.

Accordingly, this structure is made such that the transmission circuit board 43 and the receiving circuit board 45 are folded through the flexible boards 42 and 44, so that it is possible to realize a small-sized, convenient and low cost transmission or receiving module for an optical link.

In addition, a flexible board which can be folded may be extended on each of the extended lines of the transmission circuit board 43 and the receiving circuit board 45 as found in the second preferred embodiment to form a ground layer and a metallic partition plate may be placed between the transmission circuit board 43 and the receiving circuit board 45 as found in the third preferred embodiment.

Figure 14:
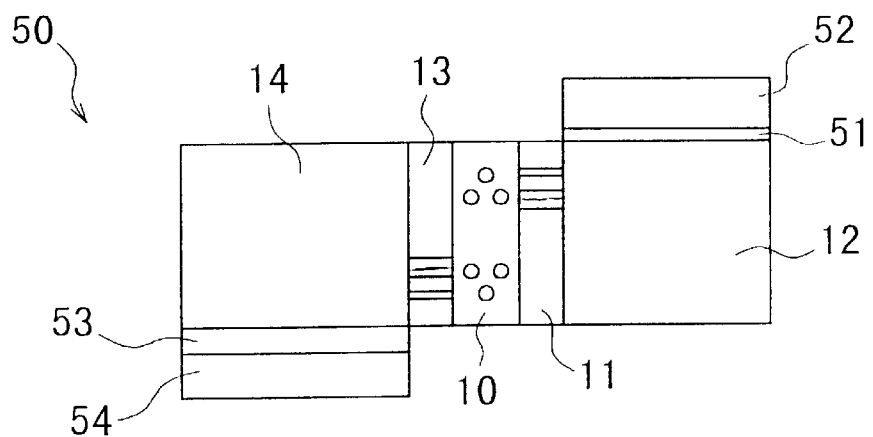
FIG. 14 is a top plan view for showing a rigid flexible board to indicate a fifth preferred embodiment.
Figure 15:
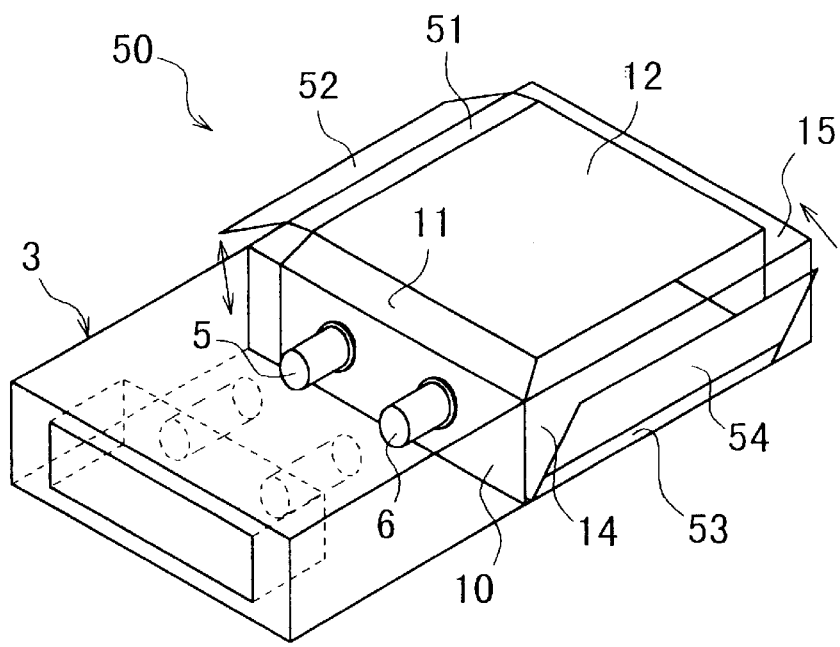
FIG. 15 is an assembling figure for showing a transmission or receiving module for an optical link to indicate a fifth preferred embodiment.

Further, FIG. 14 indicates a fifth preferred embodiment, wherein a transmission circuit board 52 is connected through a flexible board 51 in such a direction as one crossing at a right angle with an extending direction of the transmission circuit board 12 of the rigid/flexible board shown in FIG. 4, and a receiving circuit board 54 is connected through a flexible board 53 in a direction crossing at a right angle with an extending direction of the receiving circuit board 14 and in an opposite direction to that of the transmission circuit board 52 so as to form a rigid/flexible board 50. Then, as shown in FIG. 15, the transmission circuit board 12 and the receiving circuit board 14 are folded through the flexible boards 11, 13 and the transmission circuit board 52 and the receiving circuit board 54 are folded through the flexible boards 51, 53 and stored in the casing 15. With such an arrangement as above, it is possible that a practical loading of the components on the rigid/flexible board is quite freely improved.

Further, it may also be applicable that the flexible board is extended on each of the extending lines of each of the transmission circuit board 52 and the receiving circuit board 54 as found in the second preferred embodiment to form a ground layer and in addition it is also applicable that a metallic partition plate may be placed between the transmission circuit board 12 and the receiving circuit board 14 as found in the third preferred embodiment.

Figure 16:
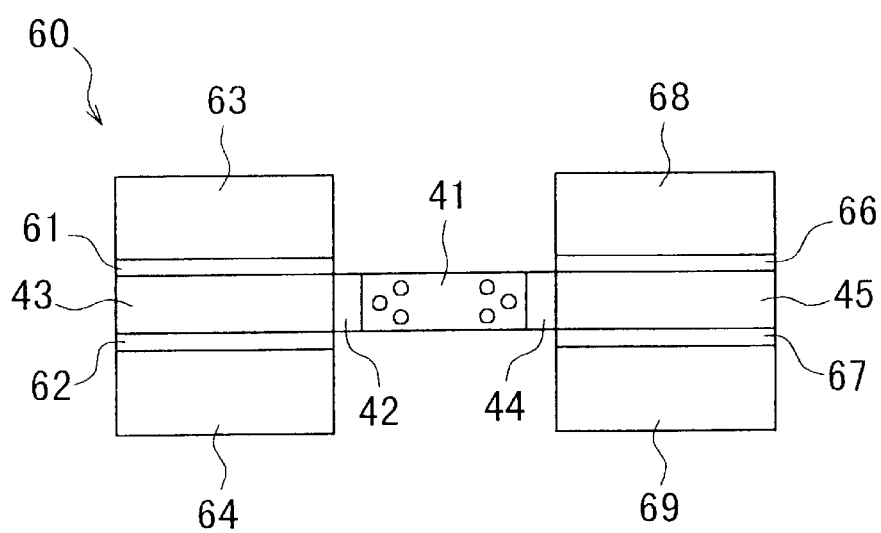
FIG. 16 is a top plan view for showing a rigid flexible board to indicate a sixth preferred embodiment.
Figure 17:
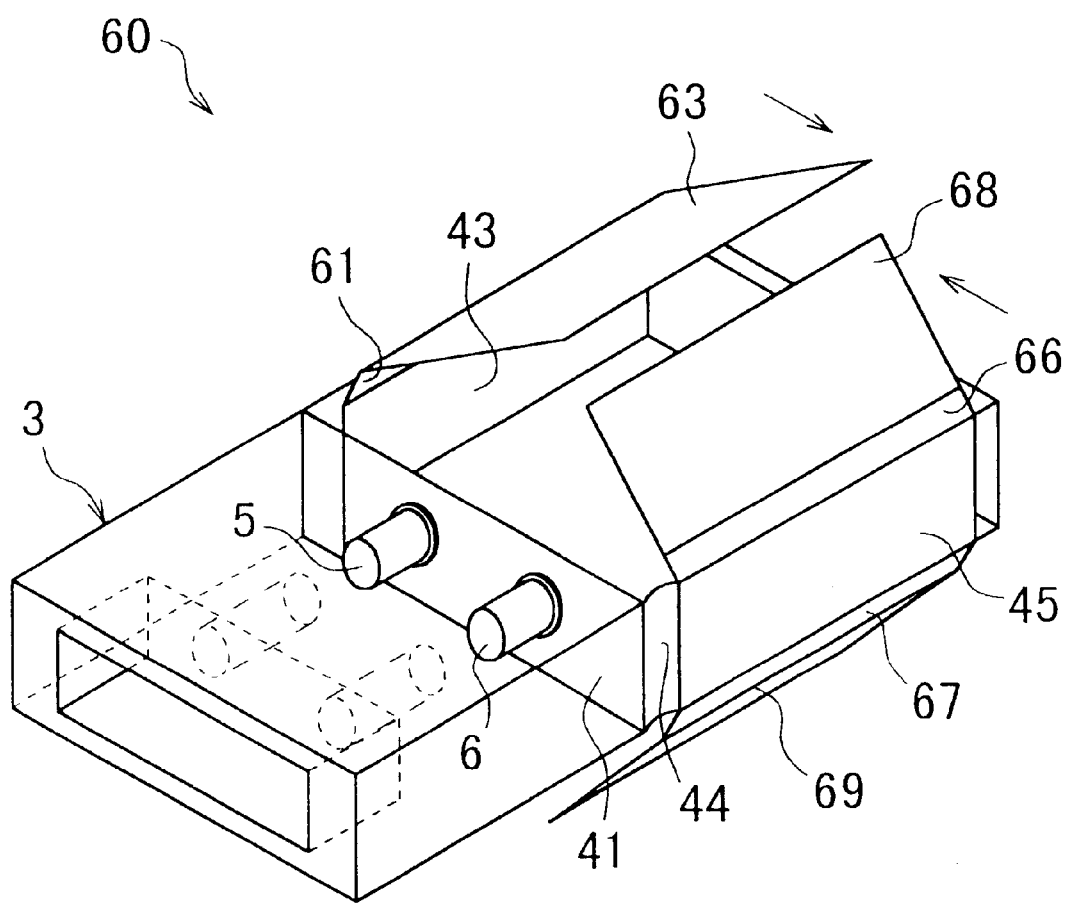
FIG. 17 is an assembling figure for showing a transmission or receiving module for an optical link to indicate a sixth preferred embodiment.

Additionally, FIG. 16 shows a sixth preferred embodiment, wherein the transmission circuit boards 63, 64 are connected at both vertical sides of the transmission circuit board 43 of the rigid/flexible board shown in FIG. 13 through flexible boards 61, 62, and the receiving circuit boards 68, 69 are connected to each other through flexible boards 66, 67 at both vertical sides of the receiving circuit board 45 to form a rigid/flexible board 60. Then, as shown in FIG. 17, the transmission circuit boards 63, 64 are folded into the casing 15 through flexible boards 61, 62, and the receiving circuit boards 68, 69 are folded into the casing 15 through flexible boards 66, 67, respectively. With such an arrangement as above, it is possible that a practical loading of the component parts on the rigid/flexible board is quite freely improved.

In addition, it may also be applicable that the flexible board is extended on each of the extending lines of each of the transmission circuit board 63 and the receiving circuit board 68 as found in the second preferred embodiment to form the ground layer, or that a metallic partition plate may be placed between the transmission circuit boards 63, 64 and the receiving circuit boards 68, 69, respectively, as found in the third preferred embodiment.

In addition, although the transmission circuit board is arranged at an upper side and the receiving circuit board is arranged at a lower side and stored in the casing in the aforesaid first, second, third and fifth preferred embodiments, it is of course apparent that they are not limited to these preferred embodiments and it may also be applicable that the transmission circuit board is arranged at a lower side and the receiving circuit board is arranged at an upper side and stored in the casing.

Additionally, although the transmission circuit board is arranged at a left side, the receiving circuit board is arranged at a right side and stored in the casing in the aforesaid fourth and sixth preferred embodiments, it is of course apparent that they may not be limited to these embodiments, but the transmission circuit board is arranged at a right side, the receiving circuit board is arranged at a left side and stored in the casing.

Further, although a pair of optical fibers are loaded at the fiber installing part of the receptacle module in the aforesaid preferred embodiments, they are not limited to these embodiments, but it may also be applicable that a plurality of pairs of optical fibers are loaded.

In addition, although the central board, the transmission circuit board and the receiving circuit board are of rigid boards in the aforesaid preferred embodiments, they may not be limited to these embodiments and it may also be applicable that the board of more than one of the central board, the transmission circuit board and the receiving circuit board is of a flexible board.

As described above, in accordance with the present invention, since the second board and the third board are folded through the flexible board, it is possible to realize a small-sized, convenient and low cost transmission and receiving module for an optical link.

In addition, since the root portions of the lead terminals of the light emitting element and the light receiving element are soldered directly to the first board, a trouble caused by extending the leads can be eliminated, a high speed operation can be attained, a transmission line capable of performing an impedance control and having a less deterioration in waveform of a signal is used as a transmission line structure on the flexible board, high quality communications showing a high speed and a high S/N ratio can be carried out.

Additionally, since as heat generating parts such as IC or the like, members having a superior thermal conduction are adhered, it is possible to attain a transmission or receiving module for an optical link having a superior thermal radiation characteristic and also a superior reliability in operation.

In addition, since only the core flexible board of at least one of the second and third boards is extended, folded and inserted between the second and third boards, it is possible to prevent deterioration of a cross-talk between the channels caused by an electromagnetic spatial interference or prevent a deterioration of a C/N ratio.

Further, since the metallic partition plate is inserted between the second and third boards, it is possible to prevent deterioration of a cross-talk between the channels caused by an electromagnetic spatial interference or prevent a deterioration of a C/N ratio.

Additionally, since each of the second and third boards is connected to each other through more than one board and the flexible board, it is possible that a practical loading of the component parts in each of the boards is quite freely improved.

Further, since more than one board of anyone of the first, second and third boards is a flexible board, storing the board within the module casing is improved quite freely.

What is claimed is:

1. A method for loading a transmission or receiving module for an optical link to be connected to optical fibers, comprising the steps of:

installing at least a pair of optical fibers at a fiber installing part;

arranging a light emitting element and a light receiving element in a direction of an optical axis of said pair of optical fibers installed at the fiber installing part;

integrally forming a rigid central circuit board electrically connected to root portions of lead terminals of the light emitting element and the light receiving element and being mechanically and electrically connected at one side edge thereof to a side edge of a first rigid side circuit board by a flexible circuit board and being mechanically and electrically connected at an other side edge opposite the first side edge to a side edge of a second rigid side circuit board by the flexible circuit board; and folding the first rigid side circuit board and the second rigid side circuit board at substantial right angles, respectively, to the rigid central circuit board in such a way that the first rigid side circuit board and the second rigid side circuit board are facing away from each other.

2. The method for practically loading a transmission or receiving module for an optical link according to claim 1, comprising the further step of applying a transmission line having a low amount of signal waveform deterioration and in which impedance control is performed on said flexible circuit board.

3. The method for practically loading a transmission or receiving module for an optical link according to claim 1, comprising the further step of separately forming said first rigid side circuit board and said second rigid side circuit board with a transmission circuit and a receiving circuit, respectively.

4. The method for practically loading a transmission or receiving module for an optical link according to claim 1, comprising the further step of forming said central, first, and second circuit boards as a rigid/flexible circuit board in which said flexible circuit board connecting each of the central circuit board and the first and second rigid side circuit boards to each other is formed as a core of the rigid/flexible circuit board.

5. The method for practically loading a transmission or receiving module for an optical link according to claim 4, comprising the further steps of connecting the flexible circuit board to one of a power supply and a ground potential, and folding and inserting an end of the flexible circuit board between the first rigid side circuit board and the second rigid side circuit board that are facing away from each other.

6. The method for practically loading a transmission or receiving module for an optical link according to claim 4, comprising the further steps of connecting a metallic partition plate to a ground potential, and inserting the metallic partition plate between said first rigid side circuit board and said second rigid side circuit board that are facing away from each other.

7. The method for practically loading a transmission or receiving module for an optical link according to claim 6, wherein said step of inserting the metallic partition plate between said first rigid side circuit board and said second rigid side circuit board that are facing away from each other includes integrally forming the metallic partition plate with at least one of a side surface, a bottom surface and a top surface of a module casing.

8. The method for practically loading a transmission or receiving module for an optical link according to claim 4, comprising the further steps of storing said rigid central, said first rigid side, and said second rigid side circuit boards in a casing while being folded and placing a member having a high thermal conduction between the casing and heat generating components on said first rigid side circuit board and said second rigid side circuit board.

9. The method for practically loading a transmission or receiving module for an optical link according to claim 1, comprising the further step of connecting at least one additional board to each of said first rigid side circuit board and said second rigid side circuit board using the flexible circuit board.

10. The method for practically loading the transmission or receiving module for an optical link according to claim 1, wherein the flexible board is one or more boards of said first, second and third boards.

* * * * *